United States Patent [19]

Dowdle, Jr.

[11] 4,028,623

[45] June 7, 1977

[54] THREE PHASE SPIN MOTOR POWER METER

[75] Inventor: James B. Dowdle, Jr., Orlando, Fla.

[73] Assignee: The United States of America as represented by the Secretary of the Army, Washington, D.C.

[22] Filed: Feb. 6, 1976

[21] Appl. No.: 655,932

[52] U.S. Cl. .............................................. 324/142
[51] Int. Cl.² ...................................... G01R 21/00
[58] Field of Search ................ 324/142; 340/310 R, 340/310 A

[56] References Cited

FOREIGN PATENTS OR APPLICATIONS 1,414,960  9/1965  France ............................... 324/142
1,313,511  4/1973  United Kingdom ............... 324/142

Primary Examiner—Stanley T. Krawczewicz
Attorney, Agent, or Firm—William G. Gapcynski; Lawrence A. Neureither; Robert C. Sims

[57] ABSTRACT

The power meter provides an analog output voltage which is proportional to power for both sine wave excitation and all other excitation types. The circuit of the meter involves the use of electronic multipliers to produce the low-ampere product of voltage and current in real time, and sums the results to produce the total power output representation for all phases.

1 Claim, 1 Drawing Figure

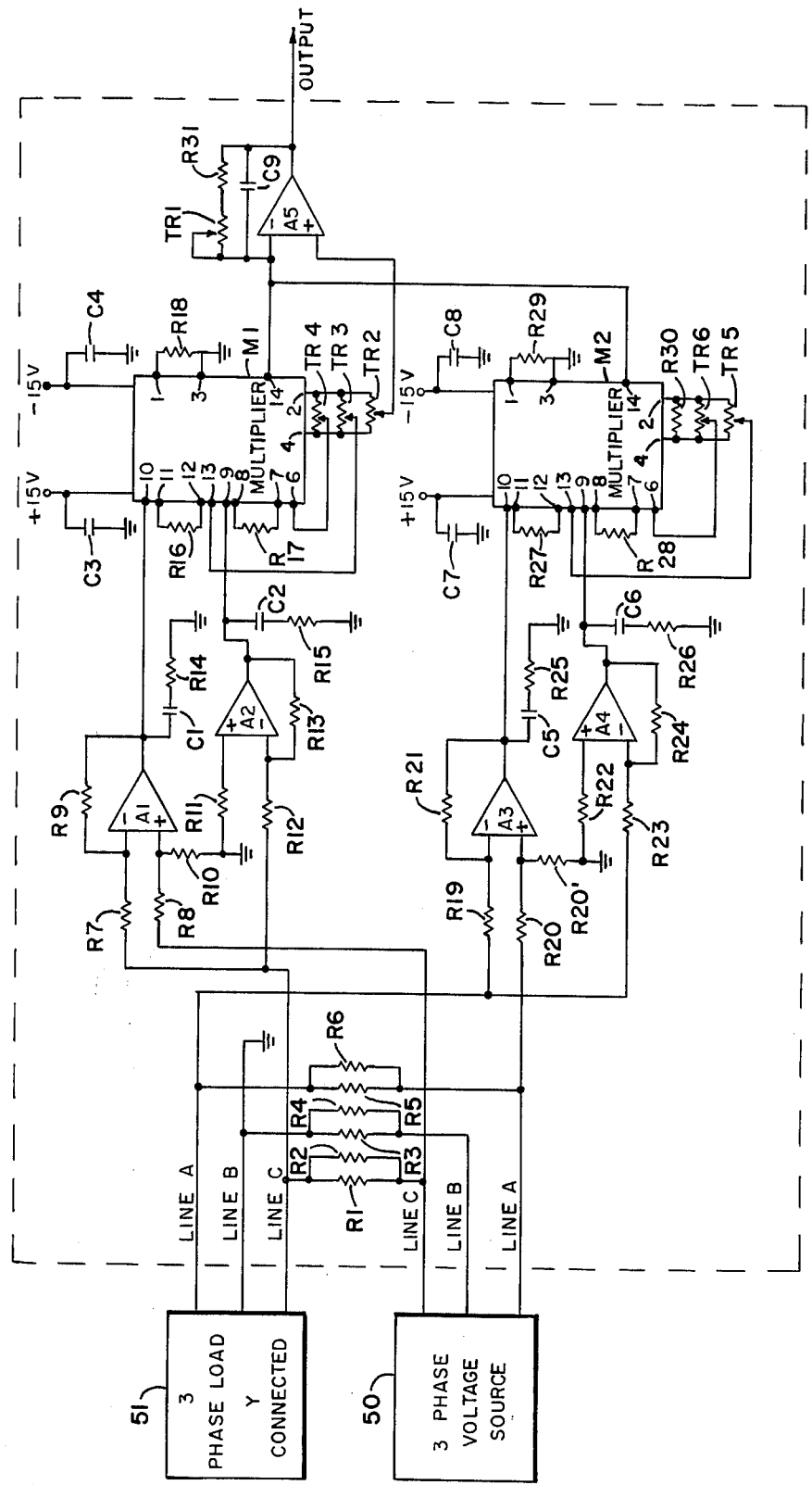

THREE PHASE SPIN MOTOR POWER METER

BACKGROUND OF THE INVENTION

This invention is related to the field of power meters. There has long been a need for an electronic method of measuring the power dissipated by a 3-phase, Y connected floating neutral gyro spin motor with a non-sine wave excitation. The prior art power meters could not provide an accurate measurement of power for quasi square wave excitation so a thermal method consuming much test time has been used in the prior art.

BRIEF DESCRIPTION OF THE DRAWING

The single figure is a schematic diagram showing the preferred embodiment of the present invention.

DESCRIPTION OF THE PREFERRED EMBODIMENT

The principle behind the operation of the electronic power meter is the equation $$P = \frac{1}{T} \int_0^T IV \, dt;$$

where $P$ = power in watts, $V$ = instantaneous voltage in volts, $I$ = instantaneous current in amperes, and $T$ = the period of the resulting product waveform.

Another concept involved is that the power dissipated in a 3-phase, Y connected, floating neutral may be measured with two wattmeters with their lows in common on one line, and the high sides connected to the other two lines. Then the total power is the sum of the two readings. If one power reading appears negative, then the total power is still the algebraic sum of the two readings and the total power is less than the sum of the magnitude of the two readings.

The circuit shown in the drawing broadly operates as follows: The total power is obtained by multiplying the line voltages $V_{A-B}$ and $V_{C-B}$ by the phase currents $I_A$ and $I_C$ respectively; then the total power is $$P = \frac{1}{T} \int_0^T (V_{A-B} \cdot I_A) + (V_{C-B} \cdot I_C) dt.$$

Currents are read out by the voltage dropped across 0.5 ohm readout resistors R1–R6. The voltage and current levels are conditioned and multiplied, and then the output currents of the two Motorola MC 1594L chip multipliers M1 and M2 (corresponding to the two volt-ampere products) are summoned to each other. The final step is to convert the current output of the multiplier to voltage and average the waveform. This is accomplished with an operational amplifier A5 in a current to voltage converter mode with a parallel RC circuit R31, TR1 and C9 used as the feedback elements.

The electronic power meter provides, first, a much less time consuming test method over the past thermal tests which consumed many hours. Then, the new meter allows one to observe changes in power consumption which occur over time periods on the order minutes or tenths of seconds, which could not be seen by the thermal method. The response of the meter is so rapid (with a circuit time constant of about 6 milliseconds) that it can measure and record transient spin up power of the spin motor 51. This is useful in evaluating the performance of the motor 51.

As explained above, the purpose of the circuitry shown in the drawing is to sum the product of the voltage from line A to line B and the current through line A with the product of the voltage from line C to line B and the current through line C. Resistors R1, R2, R5, and R6 provide current sensing for lines A and B, and R3 and R4 provide an equal line resistance in line B. Amplifiers A1 and A3 are configured as differential amplifiers, and amplify the current readout voltage from the parallel resistors R1–R2 and R5–R6 respectively. Amplifiers A2 and A4 are configured as inverting amplifiers and they amplify the two line to line voltages B-C and A-B. The output of A1 is multiplied by the output of A2 in multiplier M1, and the output of A3 is multiplied by the output of A4 in multiplier M2. The multipliers have current outputs, so the summing process is accomplished by connecting the two multiplier outputs together and to a current to voltage converter A5. Amplifier A5 provides the current to voltage conversion and the averaging.

Trimmer TR1 provides scale factor adjustment and TR2 provides offset adjustment. Trimmers TR3 and TR4 provide input offset adjustment for multiplier M1 and TR5 and TR6 adjust the input offsets of multiplier M2 in the manner known in the art. The 3-phase power source 50 is interfaced to the power meter. Likewise, the spin motor 51 (3-phase load) is the load and is interfaced with the meter. The resistors are R7-29 and capacitors C1-C8 perform well known functions of balancing, filtering, amplifier feedback, trimming, etc. and are not explained in full detail, as they are not necessary to the full understanding of the present invention.

I claim:
1. Meter for measuring the energy flows from a 3-phase quasi square excitation source to a 3-phase load with a Y connected floating neutral comprising a plurality of first amplifier means for sensing individual phase voltages; a plurality of second amplifier means for sensing individual phase currents; a plurality of multiplier means having first and second input terminals and an output terminal whereby inputs to the first and second terminals are multiplied by each other and the result fed to an output terminal; said plurality of first amplifier means having outputs connected individually to said first input terminals of the plurality of multiplier means; said plurality of second amplifier means having outputs connected individually to the second input terminal of said multiplier means; averaging means having a plurality of inputs and an output; said outputs of said plurality of multiplier means being fed to the input terminals of said averaging so that the output of the averaging means will be an average of the outputs of the plurality of multiplier means; resistors connected between the 3-phase source and the 3-phase load; said load having one phase connected to ground; said second means being two differential amplifiers connected individually across different ones of said resistors so as to measure the current flow therein; said first means being two amplifiers connected individually between one side of different ones of said resistors and ground so as to sense two phases of the voltages; said multiplier means are electronic chips; and said averaging means is a current to voltage converter connected to the chips so as to average current outputs from the chips and convert the current to voltage output for the meter.

* * * * *